(12) United States Patent
Cheong et al.

(10) Patent No.: US 7,607,073 B1
(45) Date of Patent: Oct. 20, 2009

(54) METHODS, ALGORITHMS, SOFTWARE, CIRCUITS, RECEIVERS AND SYSTEMS FOR ITERATIVELY DECODING A TAILBITING CONVOLUTIONAL CODE

(75) Inventors: Kok-Wui Cheong, San Jose, CA (US); Hui-Ling Lou, Palo Alto, CA (US)

(73) Assignee: Marvell International Ltd., Hamilton (BM)

( * ) Notice: Subject to any disclaimer, the term of this patent is extended or adjusted under 35 U.S.C. 154(b) by 364 days.

(21) Appl. No.: 11/046,070

(22) Filed: Jan. 28, 2005

Related U.S. Application Data (60) Provisional application No. 60/599,102, filed on Aug. 4, 2004, provisional application No. 60/599,105, filed on Aug. 5, 2004.

(51) Int. Cl.
*H03M 13/03* (2006.01)
(52) U.S. Cl. .................. 714/795; 341/51; 714/762; 714/755
(58) Field of Classification Search .................. 714/795
See application file for complete search history.

(56) References Cited

U.S. PATENT DOCUMENTS

| | | | | |
|---|---|---|---|---|
| 5,408,502 | A | | 4/1995 | How |
| 5,946,329 | A | * | 8/1999 | Hirose et al. ............... 714/795 |
| 6,014,411 | A | * | 1/2000 | Wang ........................ 375/259 |
| 6,088,405 | A | * | 7/2000 | Hladik et al. .............. 375/341 |
| 6,108,386 | A | * | 8/2000 | Chen et al. ................ 375/341 |
| 6,161,210 | A | * | 12/2000 | Chen et al. ................ 714/786 |
| 6,553,540 | B1 | * | 4/2003 | Schramm et al. .......... 714/790 |
| 2005/0180369 | A1 | * | 8/2005 | Hansen et al. ............. 370/338 |

OTHER PUBLICATIONS

Kok-Wui Cheong, Dimitrius-Alexandros Toumpakaris and Hui-Ling; Methods, Algorithms, Software, Circuits, Receivers and System for Decoding Convolutional Code: U.S. Appl. No. 11/051, 789, filed Feb. 4, 2005.
R. V. Cox & C-E. W. Sundberg; A Circular Viterbi Algorithm for Decoding Tailbiting Convolutional Codes; IEEE; 1993; pp. 104-107.
Charles R. Cahn; Viterbi Decoding with Tail Biting in the IEEE 802.16 Standard; Submitted to IEEE 802.16 Broadband Wireless Access Working Group on Aug. 15, 2001; http://ieee802.org.16.
C. R. Cahn; Viterbi Decoding with Tail Biting in the IEEE 802.16 Standard; Dated Aug. 15, 2001; From: Western Multiplex Corporation, 3780 Kilroy Airport Way, Suite 500, Long Beach CA 90806; 2 Pages.

* cited by examiner

*Primary Examiner*—M. Mujtaba K Chaudry
*Assistant Examiner*—Enam Ahmed (57) ABSTRACT

Methods, software, circuits and systems involving a low complexity, tailbiting decoder. The method relates to appending and/or prepending data subblocks to a serial data block, decoding and estimating starting and ending states for the serial data block, and when the starting and ending states are not identical, iterating the decoding and estimating step(s) and (eventually) disallowing at least one starting and/or ending state. The circuitry generally includes a buffer, tailbiting logic configured to append and/or prepend a subblock to the serial data block, a decoder configured to (i) decode the serial data block and (ii) estimate starting and ending states for the serial data block, and iteration logic configured to instruct the decoder to repeat the decoding and starting/ending state estimating functions when the starting and ending states are not identical. The invention advantageously reduces the complexity of a suboptimal convolutional decoder, increases the reliability of the starting and ending states, and may ensure smooth transitions at the data block ends during decoding, without adding any overhead to the transmitted data block.

28 Claims, 5 Drawing Sheets

METHODS, ALGORITHMS, SOFTWARE, CIRCUITS, RECEIVERS AND SYSTEMS FOR ITERATIVELY DECODING A TAILBITING CONVOLUTIONAL CODE

RELATED APPLICATIONS

This application claims the benefit of U.S. Provisional Application Nos. 60/599,102 and 60/599,105, filed Aug. 4, 2004 and Aug. 5, 2004, respectively, which are incorporated herein by reference in their entireties. This application may also be related to U.S. application Ser. No. 11/051,789, filed Feb. 4, 2005, which is incorporated herein by reference in its entirety.

FIELD OF THE INVENTION

The present invention generally relates to the field of encoding and decoding information. More specifically, embodiments of the present invention pertain to methods, algorithms, software, circuits, and systems for data and/or wireless communications using an iterative tailbiting Viterbi decoder.

DISCUSSION OF THE BACKGROUND

In data communications, a tailbiting trellis may be used to reduce overhead in convolutional codes that may be caused by returning the trellis to a known ending state. Terminating the encoded data with a known ending state ensures that the traceback to determine the output bits is started from the correct state with the correct cost value. If, after decoding a tailbiting trellis code, the ending state is not the same as the starting state, then a sequence decoding error may have occurred. The performance of the decoder generally degrades if the starting and ending states are unknown. However, a known ending state requires extra overhead since known bits need to be added to the transmitted signal to force the encoder to the known ending state. Tailbiting is a technique that forces the starting state to be the same as the ending state, without the penalty of the overhead bits.

In a tailbiting convolutional code, the input bits are generally grouped into a block with a fixed block length. For each fixed length block of bits, the convolutional encoder is initialized with the final data bits of the code block. Thus, at the end of the block, the encoder is at the same state as the beginning of the block. However, the convolutional decoder in the receiver does not know the starting and ending state.

Figure 1:
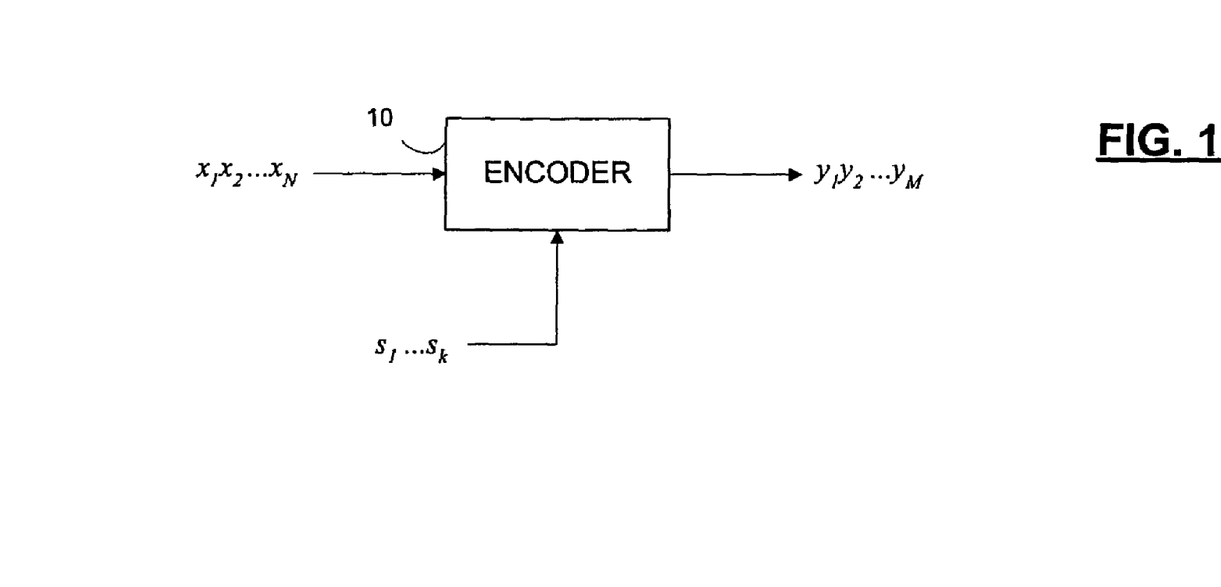
FIG. 1 is a diagram showing a conventional encoder configured to ensure that a starting state for a block of convolutional code is the same as its ending state.

FIG. 1 shows an example of an encoder 10 with a code block length of N and a convolutional code rate of M/N, with a memory length of k. Input data bits $x_1 x_2 \ldots x_N$ are convolutionally encoded by encoder 10 to produce coded data $y_1 y_2 \ldots y_M$. At any given time, encoder 10 has a state $s_1 s_2 \ldots s_k$. However, the encoder is initialized with a state that will be the same as the ending state. State $s_1 s_2 \ldots s_k$ may thus also represent the ending state of the encoded data block.

Since the beginning and ending state of coded data $y_1 y_2 \ldots y_M$ is unknown, decoding the convolutional code is more complicated. However, there will be a signal-to-noise gain since there is no rate loss penalty (or capacity loss) compared to a conventional convolutional code that includes overhead bits to provide a known ending state (i.e., a known or predetermined "tail"). In addition, all of the bits are protected equally, unlike the code with a known tail.

Generally, the optimum method for decoding tailbiting codes is to search through all possible trellis paths with the same initial and ending state, and choose the trellis path with the least cost or lowest metric (i.e., the most likely path). The initial state can be forced to a particular value by disallowing transitions from other states (e.g., in accordance with certain predetermined constraints), and the ending state can be forced to the same value by starting the traceback from the state with the same value. This optimum decoding becomes prohibitively complex when a convolutional code with many states is used, as in IEEE Standards 802.11 and 802.16a.

By exploiting the cyclic nature of the tailbiting code, a suboptimal decoding scheme with smaller decoding complexity can be used for decoding the convolutional codes. A received block of signals (which are generally concatenated) may be decoded using a regular Viterbi algorithm ("Viterbi decoding"). Ideally, in such a scheme, the output bits repeat themselves with a period equal to the block length after a few cycles of Viterbi decoding. However, this convergence may not always happen, and as a result, the algorithm is suboptimal.

To prevent Viterbi decoding from entering into an infinite loop when the algorithm does not converge, a fixed number of cyclic concatenations may be decoded, and the output bits at the end used as an estimate of the transmitted bits (see, e.g., R. V. Cox, C. E. W. Sundberg, "An efficient adaptive circular Viterbi algorithm for decoding generalized tailbiting convolutional codes," IEEE Transactions on Vehicular Technology, vol. 43, iss. 1, February 1994, pgs. 57-68). However, in this approach, the entire block of received signals is stored until the block is decoded. In a simplified alternative method, the stored code word is decoded twice, the output from the first decoding cycle is ignored, and the output from the second decoding cycle is retained as the decoded output (see, e.g., C. R. Cahn, "Viterbi Decoding with Tail Biting in the IEEE 802.16 Standard," IEEE 802.16 Broadband Wireless Access Working Group, Aug. 15, 2001). These approaches generally require more memory than conventional convolutional codes using an optimal decoding solution. However, the additional storage requirement can be satisfied in some cases by sharing memory from a deinterleaver (e.g., as is used in IEEE 802.11- and 802.16a-compliant receivers). In addition, due to the multiple decoding cycles, the Viterbi decoder has to operate at a speed that is a multiple of the data rate.

A need therefore exists to simplify the operation of Viterbi decoders further, and without sacrificing performance and/or operational efficiencies, to keep up with ever-increasing demands for increased network speeds, performance and capabilities.

SUMMARY OF THE INVENTION

Embodiments of the present invention relate to circuitry, systems, methods, algorithms and software for processing and/or determining a value for a serial data block using an iterative tailbiting Viterbi decoder. The method generally comprises the steps of (a) appending and/or prepending subblocks of the serial data block to the serial data block; (b) decoding the serial data block and estimating starting and ending states for the serial data block; and (c) when the starting and ending states are not identical, iterating said estimating and decoding step(s) and disallowing (i) the starting state and/or (ii) when said ending state is identical to a previously estimated starting state, said ending state, said previously estimated starting state, and all intervening starting and ending states. The algorithms and software are generally configured to implement one or more of the embodiments of the present method and/or any process or sequence of steps embodying the inventive concepts described herein.

The circuitry generally comprises (a) a buffer configured to receive and/or store a serial data block; (b) tailbiting logic configured to append an initial subblock and/or prepend a terminal subblock to the serial data block; (c) a decoder configured to (i) decode the serial data block and (ii) estimate a starting state and an ending state for the serial data block; and (d) iteration logic configured to instruct the decoder to (i) iterate decoding the serial data block and estimating the starting and ending states when the starting and ending states are not identical, and (ii) remove disallowed states from subsequent iteration(s). In a further embodiment, the decoder may be further configured to estimate (1) the starting state from at least part of the prepended terminal subblock and/or (2) the ending state from at least part of the appended initial subblock. The systems (e.g., a receiver, transceiver, or wireless network) generally include a circuit embodying one or more of the inventive concepts disclosed herein.

The present invention advantageously reduces the complexity of a suboptimal convolutional decoder, ensures that the decoder ultimately converges, and increases the reliability of the starting and ending states, without adding overhead to the transmitted data block. These and other advantages of the present invention will become readily apparent from the detailed description of preferred embodiments below.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions that follow are presented in terms of processes, procedures, logic blocks, functional blocks, processing, and other symbolic representations of operations on data bits, data streams within a computer, processor, controller and/or memory. These descriptions and representations are generally used by those skilled in the data processing arts to convey effectively the substance of their work to others skilled in the art. A process, procedure, logic block, function, operation, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer, data processing system, or logic circuit. It has proven convenient at times, principally for reasons of common usage, to refer to these signals as bits, streams, values, elements, symbols, characters, terms, numbers, or the like.

It should be borne in mind, however, that all of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," or the like, refer to the action and processes of a computer, data processing system, logic circuit or similar processing device (e.g., an electrical, optical, or quantum computing or processing device), that manipulates and transforms data represented as physical (e.g., electronic) quantities. The terms refer to actions, operations and/or processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

Furthermore, for the sake of convenience and simplicity, the terms "clock," "time," "rate," "period" and "frequency" are sometimes used interchangeably herein, but are generally given their art-recognized meanings. Also, for convenience and simplicity, the terms "data," "data stream," and "information" may be used interchangeably, as may the terms "connected to," "coupled with," "coupled to," and "in communication with" (which terms also refer to direct and/or indirect relationships between the connected, coupled and/or communication elements unless the context of the term's use unambiguously indicates otherwise), but these terms are also generally given their art-recognized meanings. In addition, the terms "iteration" and "cycle" generally refer to a single decoding sequence (from starting to ending state) as practiced herein, but the term "iteration" generally refers to a repeated (e.g., second, third or further) decoding cycle.

The present invention concerns methods, algorithms, software, circuitry, and systems for processing (and/or determining a value for) a serial data block using an iterative, tailbiting Viterbi decoder. The method generally comprises the steps of (a) appending and/or prepending subblocks of the serial data block to the serial data block; (b) decoding and estimating starting and ending states for the serial data block; and (c)

when the starting and ending states are not identical, iterating said estimating and decoding step(s) and disallowing at least one of (i) the starting state and/or (ii) a previously estimated starting state, said ending state, and all intervening starting and ending states when said ending state is identical to the previously estimated starting state. The algorithms and/or software are generally configured to implement one or more of the embodiments of the present method and/or any process or sequence of steps embodying the inventive concepts described herein, although the term "algorithm" in this context is meant in a general sense (e.g., a logical sequence of steps taken to perform one or more mathematical and/or computational processes and/or operations), rather than a more specific, technical sense (such as "Viterbi algorithm," mentioned below).

The circuitry generally comprises (a) a buffer configured to receive the serial data block; (b) tailbiting logic configured to append an initial subblock and/or prepend a terminal subblock to the serial data block; (c) a decoder configured to (i) decode the serial data block and (ii) estimate a starting state and an ending state for the serial data block; and (d) iteration logic configured to instruct the decoder to (i) iterate decoding the serial data block and estimating the starting and ending states when the starting and ending states are not identical, and (ii) remove disallowed states from subsequent iteration (s). In a further embodiment, the decoder may be further configured to estimate (1) the starting state from at least part of the prepended terminal subblock and/or (2) the ending state from at least part of the appended initial subblock. The systems (e.g., a receiver, transceiver, or wireless network) generally include a circuit embodying one or more of the inventive concepts disclosed herein.

The present invention advantageously reduces the complexity of a suboptimal convolutional decoder, ensures convergence during decoding, increases the reliability of the starting and ending states, and in certain embodiments, ensures smooth or continuous state transitions at the beginning and end of the serial data block during decoding, without adding overhead to the transmitted data block. The invention, in its various aspects, will be explained in greater detail below with regard to exemplary embodiments.

Exemplary Methods

The present invention relates to methods of determining a value for a serial data block, generally involving decoding the serial data block and estimating its starting and ending states, and if the starting and ending states are not the same, iterating (repeating) the decoding and estimating step(s) and disallowing at least one starting and/or ending state, although not necessarily contemporaneously with or immediately following a first decoding cycle or a first decoding iteration. For example, in one embodiment, when said estimated ending state is identical to a previously estimated starting state (i.e., a starting state from a previous cycle or iteration of decoding), then the ending state, the previously estimated starting state, and all starting and ending states from intervening decoding cycles ("intervening starting/ending states") are disallowed. One further embodiment focuses on prepending and appending subblocks of the serial data block to the serial data block, and alternative embodiments relate to either appending an initial subblock or prepending a terminal subblock of the serial data block to the serial data block. These latter aspects of the invention are intended to reduce suboptimal decoder complexity, prevent non-convergence, and increase the reliability of the decoder starting and ending states, without requiring additional overhead in the transmitted data block.

Prepending and Appending Subblocks to the Serial Data Block

The present invention reduces suboptimal decoder complexity largely by appending an initial subblock of the serial data block to the serial data block, prepending a terminal subblock of the serial data block to the serial data block, or both. This technique is generally disclosed in copending U.S. application Ser. No. 11/051,789, filed Feb. 4, 2005, and U.S. Provisional Application No. 60/599,105, filed Aug. 5, 2004, which are incorporated herein by reference in their entireties. Appending and prepending subblocks to the seal data block ensures smooth or continuous state transitions at the beginning and end of the serial data block during decoding, without reducing the reliability of the starting and ending states or adding any overhead to the data block transmission. It is believed that smooth or continuous decoding transitions result from the code trellis being in a steady state at the time of the transitions from the end of the prepended terminal subblock to the beginning of the serial data block and from the end of the serial data block to the beginning of the appended initial subblock. Thus, appending and/or prepending data subblocks are important aspects of the present invention, and a thorough understanding thereof will be useful for understanding the present iterative tailbiting decoding scheme.

The term "data block" generally refers to a data sequence of fixed and/or known length. Thus, the serial data block processed in the present method may have a length N. For example, 80 bits is a conventional fixed block length in certain digital audio standards. Even though the present decoding step is suboptimal and has reduced complexity relative to those described in the background references mentioned above, the present method enjoys particular applicability to decoding data blocks of relatively short length. Thus, in various implementations, N is from 32 to 256 bits, 40 to 200 bits, or 60 to 100 bits. However, in the present method, the convolutional code may be concatenated with one or more further convolutional codes (e.g., a "dual k" code) and/or a block code (e.g., a Reed-Solomon or error correction code). As a result, the received data block is not necessarily limited to such short sequences, but the data block being decoded according to the present invention preferably has a relatively short length.

Furthermore, each of the initial subblock and the terminal subblock may have an integer length of L bits, where L is at least a traceback depth. A "traceback depth" is generally related to, and thus may be selected or determined in a manner dependant on, the memory length and/or constraint length of the convolutional code. The traceback depth is generally the decoding depth (e.g., in a Viterbi decoder) where paths that start from any state should converge, and is typically further dependent on the code rate, the channel in which the system operates, the desired or target decoder performance and the initial state of the decoder (to the extent it is known). As the memory length of the convolutional code increases, the number of states increases, and the traceback depth increases. For example, in a conventional (d,k) code, k refers to the memory of the code (e.g., the maximum number of consecutive bits having the same value or state; i.e., "same state bits") and d refers to the free distance of the code. In a number of conventional wireless communications protocols, k is 6. The constraint length of a convolutional code is generally (k+1) bits. Of course, the traceback depth depends somewhat on the decoding algorithm. An algorithm adapted to start a traceback from a minimum state will have a shorter traceback depth than an algorithm adapted to traceback from an arbitrary state. Thus, generally speaking, the longer the traceback depth, the better the decoder performance.

The code may comprise nearly any cyclic code, such as convolutional codes and trellis codes. Also, the convolutional and/or trellis code may have a constraint length commonly used in wireless applications and/or digital broadcasting (e.g., audio) standards. Also, the requirement that the starting and ending states be the same is a constraint that exists for all tailbiting codes. However, most if not all convolutional coding schemes and algorithms suitable for use in or with the present invention are proprietary, and the associated constraints do not lend themselves well to general characterization. In a variety of applications for which the present invention is particularly suited, the convolutional code and the constraint(s) thereon comply with a wireless data transmission protocol and/or digital broadcasting standard, such as IEEE Standard 802.11a, 802.11b, 802.11g, 802.11n, 802.16 and/or 802.20. Thus, the method may further comprise the step of receiving the fixed-length, serial data block.

As will be explained in greater detail below, the present decoding step preferably comprises Viterbi decoding the serial data block and at least one of the prepended terminal subblock and the appended initial subblock. Viterbi decoding at least a part of the prepended terminal subblock having a length of at least the traceback depth of the serial data block code may provide an estimate of the starting state. Viterbi decoding the serial data block determines or (if weighting factors are employed) calculates a most likely sequence for the serial data block. Viterbi decoding at least a part of the appended initial subblock having a length of at least the traceback depth of the serial data block code may estimate or determine a value for the ending state. When the prepended terminal subblock and appended initial subblock each have a length of at least a traceback depth, Viterbi decoding should converge by the time the end of the prepended terminal subblock is reached, then again at the end of the received data block.

One advantage of the present method is that it provides a degree of built-in error checking. For example, when the starting state and the ending state are not the same, this is a good indication of an error in the decoding (e.g., in the transmitted sequence or in the appended and/or prepended subblocks). Thus, the method may further comprise the step(s) of comparing the estimated starting state and the estimated ending state, and optionally, indicating an error if the estimated starting state and the estimated ending state are not identical.

Figure 3:
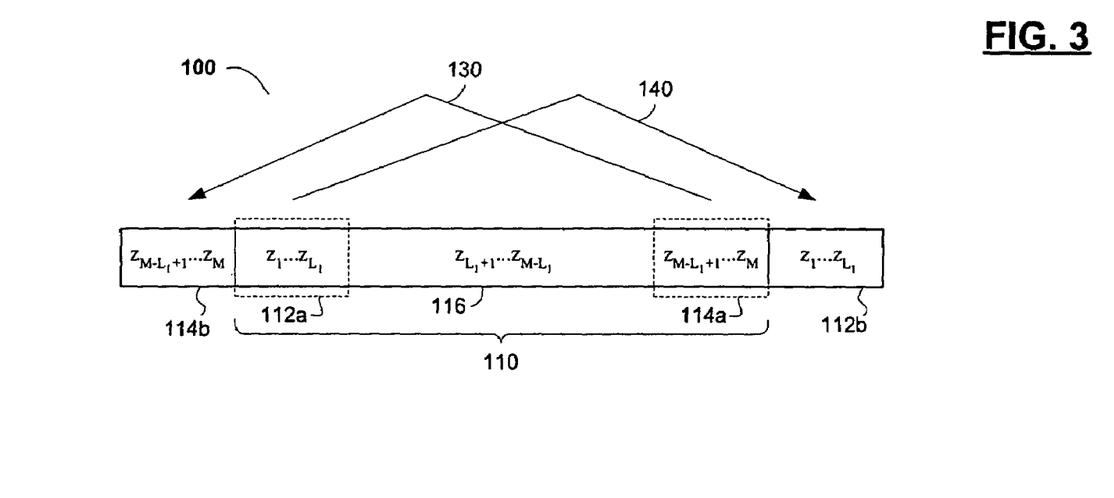
FIG. 3 is a diagram showing a modified code block for processing and decoding according to the present invention, in which an initial subblock is appended and a terminal subblock is prepended to a serial data block.

FIG. 3 shows an exemplary "circularized" code block 100 for use in the present invention. Circularized code block 100 comprises an encoded block 110 (in turn, comprising initial subblock 112a, data subblock 116 and terminal subblock 114a), a prepended subblock 114b and an appended subblock 112b. As shown by arrow 130, terminal subblock 114a is copied and prepended to the beginning of encoded block 110, and as shown by arrow 140, initial subblock 112a is copied and appended to the end of encoded block 110. As a result, a decoder ending state consisting of terminal subblock 114a and appended subblock 112b (or a subsequence thereof having a predetermined minimum length) will generally have the same state or value as a decoder starting state consisting of prepended subblock 114b and initial subblock 112a (or a corresponding subsequence thereof having the same predetermined minimum length). The present invention thus enables elimination of the conventional "known starting/ending state" overhead bits, because the starting and ending states (which may be generated by circularly combining starting and ending data subblocks) are essentially forced to be the same by design, regardless of the actual value of the initial and terminal subblocks. This may be more easily understood with reference to a more specific example.

If initial subblock 112a consists of a sequence $z_1 \ldots z_{L_1}$, and terminal subblock 114a consists of a sequence $z_{M-L_1+1} \ldots z_M$, then appended subblock 112b will consist of the sequence $z_1 \ldots z_{L_1}$ and prepended subblock 114b will consist of the sequence $z_{M-L_1+1} \ldots z_M$. Circularly combining these blocks as shown in FIG. 3 and as described above leads to "circularized" code block 100 having a decoder starting state 114b-112a of $v_{N-L+1} \ldots v_N v_1 \ldots v_L$ and a decoder ending state 114a-112b of $v_{N-L+1} \ldots v_N v_1 \ldots v_L$ (where $v_i$ represents the state $s_i$ and, in general, v represents the states $s_1 \ldots s_k$), the same state regardless of the actual value of subblocks 112a and 114a. Such circular prepending and appending of encoded creates smooth (or continuous) state transitions at the edges of the original code block 110, and can effectively increase the efficiency and/or channel capacity of the code by enabling elimination of the conventional "known starting/ending state" overhead bits.

Viterbi decoding generally starts from the beginning of the circularized code block 100 (e.g., bit $z_{M-L_1+1}$ of prepended subblock 114b) and stops at the end of the circularized code block 100 (e.g., bit $Z_{L_1}$ of appended subblock 112b). Initially, Viterbi decoding may be conducted with an equal metric for all states. However, the decoder generally does not output the bits from the prepended subblock 114b or the appended subblock 112b.

The prepended subblock 114b generally ensures that the starting state is reliable, and the appended subblock 112b generally ensures that the ending state is reliable. Although the reliability of the starting state and ending state estimates are generally better than conventional tailbiting decoding methods, there may be error patterns that cause a mismatch in the starting state and the ending state in the present invention. In general, the occurrence of such a mismatch indicates a sequence detection error. In the present invention, the Viterbi algorithm is re-run using knowledge of this error information, by disallowing one or both of the estimated starting and ending states (preferably, only one of these states, and in one implementation, the estimated/decoded starting state).

The increase in decoding complexity for the present scheme relates to the operations associated with decoding the prepended and appended code subblocks. The average increase in complexity in the present decoding scheme may be less than 2 times, but the decoding hardware generally has to design for the worst case. Consequently, the present invention assumes that the starting and ending states may not be forced to the same state, and/or that Viterbi decoding may not converge on the first attempt. As a result, the present decoding scheme iterates decoding when a single decoding cycle is insufficient, and disallows at least one of the estimated starting and ending states (and, in some embodiments, the decoded data) when subsequent decoding iterations indicate that a decoding error may have occurred or that decoding may not converge, thereby forcing the subsequent cycles of decoding ultimately to converge.

An Exemplary Iterative Tailbiting Decoding Scheme

Objects of the present iterative tailbiting decoding scheme include obtaining a reliable starting and ending state and ensuring by design that they are the same, but with reduced or minimal decoding complexity. At a certain subblock length (generally at least the decoder traceback depth), the Viterbi algorithm will, in most cases, be likely to have converged. Although convergence is not guaranteed at this traceback depth, a predetermined minimum traceback depth of at least an integer multiple of the code memory length (i.e., at least two times) generally leads to a commercially acceptable sequence error rate at a reasonable latency.

In the scheme shown in FIG. 3, the Viterbi algorithm (i.e., decoding) will start from the beginning of the modified code block 100 (i.e., the beginning of appended subblock 114b) with an equal metric for all states, and stop at the end of the modified code block 100 (i.e., the end of prepended subblock 112b). However, the decoding method/algorithm generally does not output the bits from the prepended code subblock 114b or appended code subblock 112b. The prepended code subblock 114b ensures a reliable starting state, and the appended code subblock 112b ensures a reliable ending state, as discussed above. If the decoded starting and ending states are the same, the bits decoded from code block 110 are the output bits, and the next serial data block received is subsequently decoded.

Although the reliability of the starting state and ending state estimates according to the scheme exemplified in FIG. 3 are generally acceptable, there may be error patterns that cause a mismatch in the starting state and the ending state. In this case, one may indicate an error in sequence detection (e.g., in the determination of a "most likely value" for the decoded code block). The present tailbiting decoder responds to this detected sequence error by performing one or more subsequent iterations (i.e., repetitions) of the decoding and estimating steps (e.g., the Viterbi algorithm).

Figure 4:
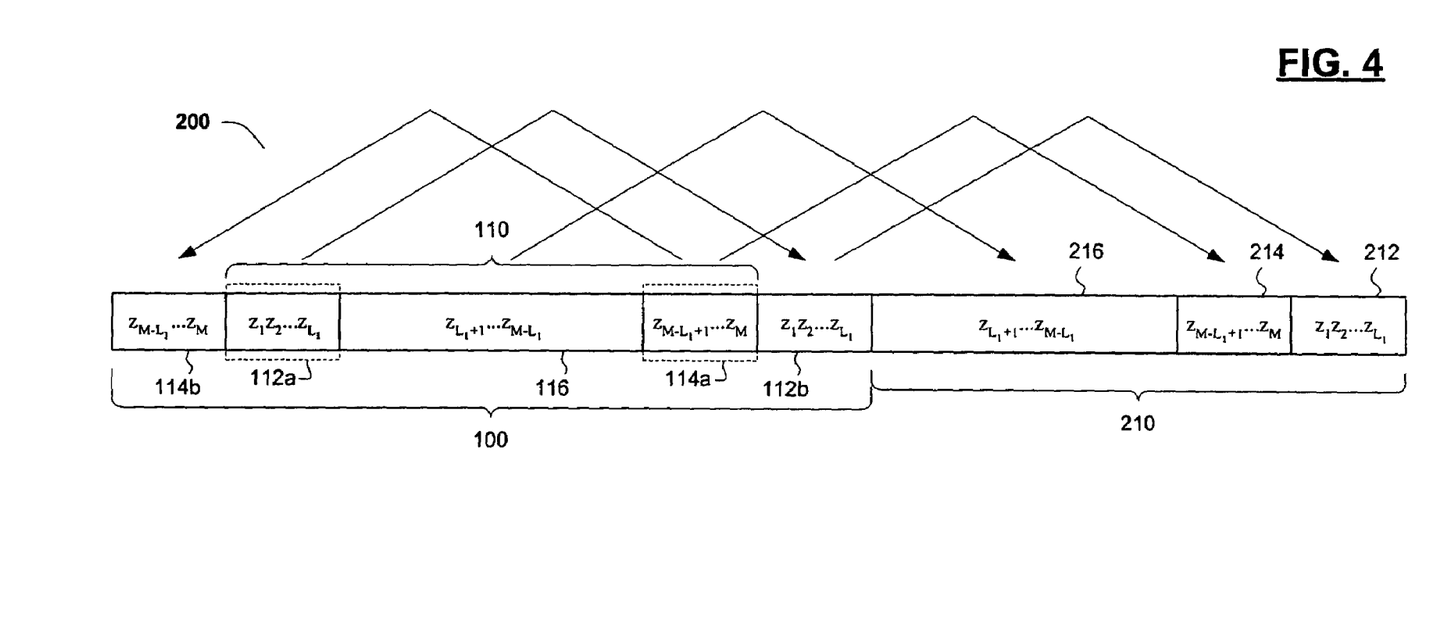
FIG. 4 is a diagram showing an implementation of an iterated code block according to the present invention.

FIG. 4 shows a modified, iterated code block 200 after a first iteration. In the first iteration, iterated code block 210 is appended to modified code block 100. Iterated code block 210 generally comprises iterated internal code block 216, iterated terminal subblock 214 and iterated, appended initial subblock 212. Iterated internal code block 216 generally has the same length and identity as internal code block 116 of received code word 110; iterated terminal subblock 214 generally has the same length and identity as terminal subblock 114a of received code word 110; and iterated, appended initial subblock 212 generally has the same length and identity as initial subblock 112a of received code word 110.

Figure 5:
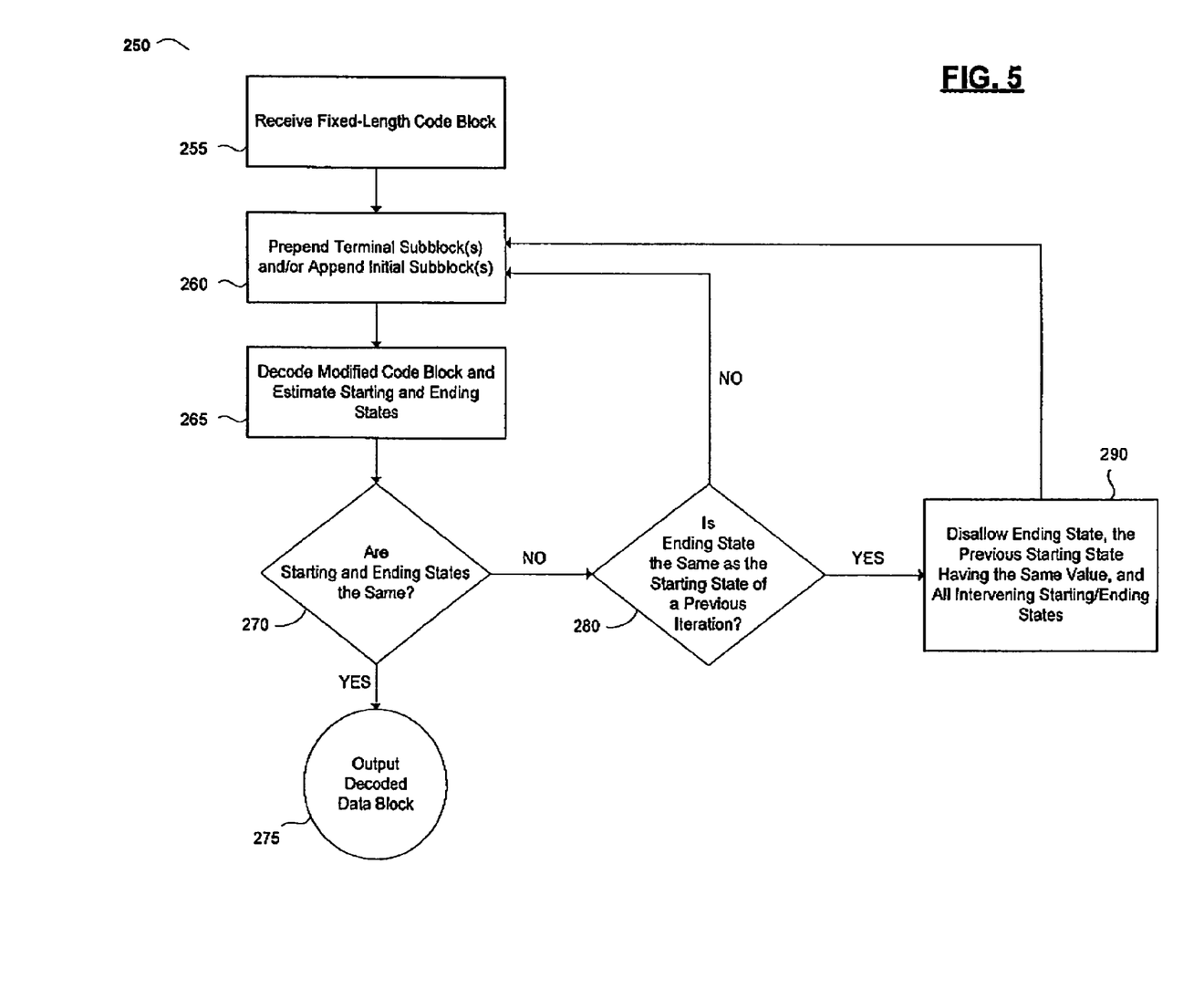
FIG. 5 is a flow chart for an embodiment of the present iterative decoding process.

FIG. 5 is a flow chart 250 exemplifying the present iterative decoding method. In step 260, a fixed length code block (e.g., code word 110 in FIG. 4) is received. Referring back to FIG. 5, in step 260, an initial subblock is appended and/or a terminal subblock is prepended (e.g., to form modified code word 100 in FIG. 4). In step 265 of FIG. 5, the modified code block is decoded, and a decision is made in step 270, depending on whether the decoded starting and ending states are the same. If they are, then the decoded data (e.g., corresponding to received code word 110 in FIG. 4) are output in step 275 of FIG. 5, and the process ends. If the decoded starting and ending states are not the same, then another decision is made in step 280, depending on whether the decoded ending state is the same as any decoded starting state in any previous iteration. If they are not, then the decoding steps 260 and 265 are iterated (i.e., repeated). However, if the decoded ending state matches a decoded starting state of a previous iteration (note that decoded starting state of an $n^{th}$ previous iteration is also the decoded ending state of a $[n+1]^{th}$ previous iteration), the decoded ending state, the matching decoded starting/ending state and all intervening decoded starting/ending state[s] are disallowed in step 290, then the decoding steps 260 and 265 are iterated.

Referring back to FIG. 4, in the first iteration, the ending state may be estimated from combined iterated terminal subblock 214 and appended iterated initial subblock 212, and the starting state "estimation" may simply be the initial ending state estimation from decoding the modified code block 100 (i.e., from decoding terminal subblock 114a and appended initial subblock 112b). Thus, if the starting and ending states are the same in the second iteration, the appended initial subblock 112b, iterated internal code block 216, and iterated terminal subblock 214 are output as decoded data.

The ACS (add-compare-select) results of the first decoding cycle are generally stored and used logically in the first (or a subsequent) iteration. The ACS portion of the algorithm continues from the point that it left off in the first cycle (i.e., the transition from the end of modified code block 110 and/or terminal subblock 114a to the beginning of appended initial subblock 112b and/or iterated code block 210). Other than (re)using computations from the previous iteration(s), the present decoding scheme for the first and/or subsequent iteration works in the same way as the first cycle. The decoded starting and ending states from the previous cycles and/or iterations are recorded (e.g., stored in a temporary, accessible memory such as a register), in part to detect cycles of decoded starting and ending states with cycle length larger than two (2) and in part to compare "current iteration" ending states with starting and/or ending states of previous iterations. The present iterative tailbiting Viterbi algorithm continues in this manner until (i) the decoded starting state and ending state match (in which case, the decoded data are output), (ii) the decoded ending state matches a decoded starting state of a previous iteration (in which case, the decoded ending state, the matching decoded starting/ending state and all intervening decoded starting/ending state[s] are disallowed), or (iii) all allowed starting/ending state are exhausted (in which case, the state with the smallest associated metric is selected, decoding has effectively converged, and the decoded data corresponding thereto are output).

When cycles of decoded starting and ending states with cycle length larger than two occur, the decoder, in theory, might not terminate. In order to prevent this non-convergence and to ensure a finite termination of the decoder, when cycles of decoded starting and ending states with cycle length larger than two occur, the iterative tailbiting Viterbi algorithm is reset. The iterative algorithm returns to the first cycle scenario with a new modified code block, essentially that of iterated block 210. However, the ACS algorithm is modified to prohibit or disallow at least the starting states that occurred in the previous decoding cycle(s) by forcing a high metric in those states at the beginning of the ACS steps in subsequent iterations of the Viterbi algorithm. Thus, when the ending state of a current iteration does not match any starting/ending state of any previous iteration, only the starting state of the current iteration (which is also the ending state of the most recent previous iteration) may be assigned a high metric. However, when the ending state of a current iteration matches the starting state of a previous iteration, the current iteration ending state, the matching previous iteration starting state, and all starting/ending states therebetween are assigned a high metric.

For example, a first cycle may estimate a starting state "A" and an ending state "B". A second cycle uses ending state "B" from the first cycle as its starting state, and may estimate an ending state "C". A third cycle uses ending state "C" from the second cycle as its starting state, but may estimate an ending state "B". In this case, states "B" and "C" are disallowed, as ending state "C" is identical to the previously estimated state "B" (which was the starting state in the second cycle). If states "B" and "C" are not disallowed, decoding cannot converge, as the decoder will be in an infinite loop, cycling between states "B" and "C." Similarly, if ending state "A" is estimated in the third cycle, then states "A," "B" and "C" are disallowed, as ending state "C" is identical to the previously estimated starting state "A." In either of these cases, the next cycle/iteration starts over by decoding from the beginning of the (modified) data block and estimating a new starting state. Naturally, if ending state "C" is estimated in the third cycle, then the decoded data block is output, and the next data block is processed. Also, if a fourth ending state "D" is estimated in the third cycle, then another estimating/decoding iteration is performed. After any cycle in which the starting and ending states do not match, the starting state may be assigned a high metric to disallow it. While this level of "state pruning" is not required for the invention to be effective, it can help lead to convergence by exhaustion of allowable states. Also, one can easily design logic configured to (i) recognize such disallowed states and (ii) disallow the starting and ending states of a current iteration when the ending state is a disallowed state.

By assigning a high metric to starting/ending (and optionally, decoded data) states that occurred in previous decoding cycles, those states will generally not occur in subsequent cycles. As a result, the present decoding algorithm ensures by design termination of the "most likely value" determination since the states that did not lead to the starting and ending states being the same are removed, or disallowed. In the event that the last cycle exhausts all states, the state with the smallest metric is generally taken as the starting and ending state. The eventual result from the present decoding algorithm is that the decoded starting and ending state are the same by design. This is a necessary condition (or constraint) for tailbiting trellis-based code.

Because the present decoding scheme accounts for the possibility of subsequent iterations, it is generally more complex than a regular Viterbi decoder that does not consider a tailbiting constraint. The number of iterations resulting in a tailbiting condition (i.e., where the estimated starting and ending states are the same) depends on the signal-to-noise ratio (SNR) in the operating region, which in many cases, can be determined through simulation.

In hardware, an "offload" iterative Viterbi decoder can be built that performs the subsequent iteration only when the tailbiting condition fails at the first iteration (see the discussion of the exemplary circuit below). This "offload" iterative decoder may be turned on only when it is needed, so that power consumption can be reduced, while still achieving a SNR gain comparable to conventional tailbiting trellis-based codes. Thus, when the starting and ending states are not identical, the present method may further comprise enabling iteration logic prior to repeating the decoding and estimating steps.

Appending an Initial Subblock and Outputting Decoded Data from within the Serial Data Block In a further embodiment, the present method appends the initial subblock to the serial data block, decodes a remainder of the serial data block and the appended initial subblock, and outputs the decoded serial data block remainder and the decoded appended initial subblock. In this embodiment, the serial data block remainder generally consists of the serial data block minus the initial subblock. Thus, decoded data is generally output beginning at the first bit position following the initial subblock (e.g., $z_{L_1+1}$, where $z_{L_1}$ is the last bit of the initial subblock).

The method may further comprise comparing the estimated starting state and the determined ending state, and optionally, indicating an error if the estimated starting state and the estimated ending state are not identical. Furthermore, the initial subblock may have an integer length of from 2 to N/2 bits (or, as shown in FIG. 5, L), and preferably, at least a traceback depth.

Viterbi decoding is also a preferred aspect of this embodiment. For example, the step of estimating a starting state for the initial subblock (or a partial sequence thereof) may comprise Viterbi decoding a remainder portion of the initial subblock. In such a case, the decoding step may comprise Viterbi decoding the serial data block remainder and at least a first portion of the appended initial subblock. As a result, the method may further comprise the step(s) of (i) determining an ending state from the (decoded) appended initial subblock (or a partial sequence thereof), and/or (ii) reversing the order of the Viterbi decoded serial data block remainder and the Viterbi decoded appended initial subblock to provide a Viterbi decoded serial data block. Decoded data may be reversed (or re-ordered) by storing the decoder output in a buffer having appropriate pointer logic to indicate the correct bit positions for the decoded data. When the decoded data are output in parallel (e.g., when the decoder has a parallel downstream interface), there is no latency penalty using this approach.

The complementary approach is effective as well. For example, the method may further comprise prepending a terminal subblock (the terminal subblock comprising a first terminal subblock portion or sequence and a terminal subblock remainder), and the step of estimating a starting state may comprise Viterbi decoding at least the first prepended terminal subblock portion (and preferably the entire prepended terminal subblock). The decoding step may comprise Viterbi decoding the terminal subblock remainder, the initial subblock and an internal data block portion including at least part of the terminal subblock (preferably up to the end of the first terminal subblock portion), and the step of determining an ending state may comprise Viterbi decoding at least the terminal subblock remainder (and preferably the entire terminal subblock). Of course, as for the appended initial subblock embodiment, the method may further comprise reversing the order of (i) the Viterbi decoded prepended terminal subblock remainder and (ii) the Viterbi decoded initial subblock and the Viterbi decoded internal data block portion (which may include the first terminal subblock portion) to provide a decoded serial data block.

Figure 6:
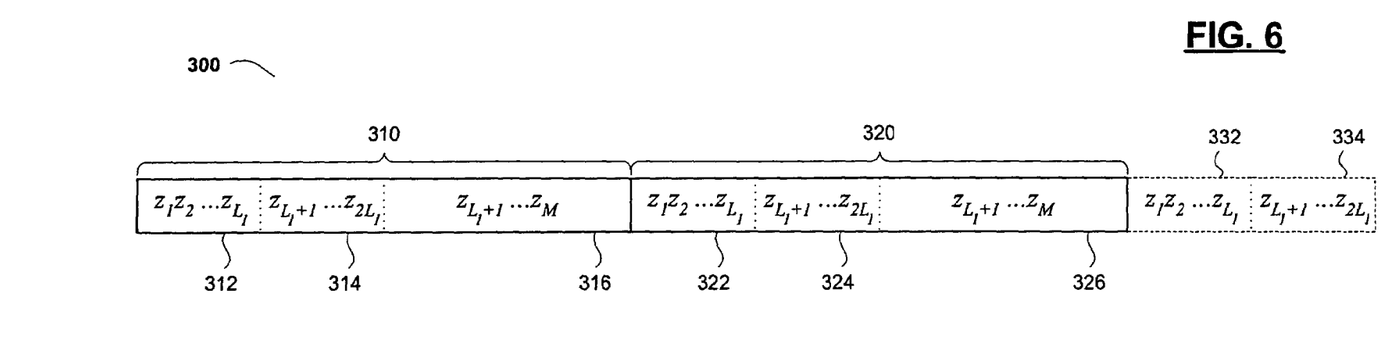
FIG. 6 is a diagram showing an alternative implementation of an iterated code block according to the present invention, in which a terminal subblock is prepended to the serial data block and the decoded data is output from a location internal to the data block.

FIG. 6 shows an exemplary serial data block configuration 300 for processing convolutional code according to this embodiment, generally comprising a received serial data block 310, iterated data block 320, and appended initial subblocks 332 and 334. Generally, appended initial subblocks 322 and 332 are identical to initial data subblock 312 (e.g., the first $L_1$ bits of serial data block 310), and appended initial subblock remainders 324 and 334 are identical to initial subblock remainder 314 (e.g., the second $L_1$ bits of serial data block 310). Like the embodiment(s) described above, serial data block 310 may be received and stored in a buffer, and the first $L_1$ bits 312 may be Viterbi decoded to provide an estimate of the starting state of the data block and/or decoder trellis (typically determined when the decoder has decoded initial subblock remainder 314, assuming initial subblock remainder 314 has a length of about a traceback depth). However, beginning at bit position $z_{L_1+1}$, initial subblock remainder 314 of the serial data block 310 is generally decoded and output as the value for bit positions $z_{L_1+1}$ through $y_M$ of the serial data block 310. After the serial data block remainder 316 is decoded, appended initial subblocks 332 and 334 are decoded, but decoded data are output only from appended initial subblock 332. Viterbi decoding the appended initial subblock 322 provides the value for bit positions $z_1$ through $z_{L_1}$ of the serial data block, and Viterbi decoding appended initial subblock remainder 324 provides a continuous state transition for decoding at the end of appended initial subblock 322, thereby improving the reliability of the ending state estimate, determination or calculation.

As described above, because the identity and/or sequence of appended subblocks 322 and 332 and initial subblock 312 are identical, the starting state and ending state are generally ensured by design to be identical. Because the appended subblock 322 generally has a length of at least the traceback depth, the decoder trellis will be in a steady state and have a maximum likelihood for convergence when the remainder 314 of the serial data block 310 is decoded.

One advantage of this approach is that the decoder can generally operate at the same speed as the rest of the receiver circuitry (although there may be a latency of L bits in the decoder output). However, because the data is output from a position in the middle of the received data block 310, the data output from the decoder will not be in the same sequence as the received serial data block 310. Thus, the present method may further comprise the step of reversing, re-ordering or rearranging the decoded data, such that the decoded appended subblock is subsequently read, output or transmitted before the decoded serial data block remainder. Because this embodiment appends or prepends a subblock having a length as short as twice the decoder traceback depth, this embodiment may be advantageous when the code block is slightly larger than in the first embodiment (e.g., from about 60, 80 or 100 bits to about 250, 500, or 1000 bits).

When the starting state and ending state are not identical (e.g., Viterbi decoding appended code subblock 322 and initial data subblock 312 leads to different results), a first iteration in the present decoding scheme is performed, using iterated code block 320 and iterated appended subblocks 332 and 334. Decoding and starting and ending state estimating from appended subblocks 322/324 and iterated appended subblocks 332/334, respectively, is performed as for the first decoding cycle using received data block 310 and appended subblocks 322 and 324. In the first iteration, when (for example) appended subblock 322 and iterated appended subblock 332 are Viterbi decoded to the same state, then the tailbiting constraint is met, and the decoded iterated code block 320 (formed from appended initial subblock remainder 324, data block remainder 326 and iterated, appended initial subblock 332) is output as decoded data. If (for example) appended subblock 322 and iterated appended subblock 332 are Viterbi decoded to different states, then a second iteration is performed, essentially in the same manner as the first iteration. Since the first two starting states did not lead to convergence or matching of the starting and ending states, and are no longer needed to estimate a starting or ending state they may be disallowed at this time (optionally, the first starting state initial subblocks 312/314 may be disallowed after the first iteration ends). Preferably, however, the current iteration starting and ending states are disallowed only when the current iteration ending state (e.g., from iterated, appended subblock 322) is the same as the starting state of a previous cycle or iteration (e.g., from initial subblock 312), in which case the starting and ending states of all intervening iterations or cycles are also disallowed. This process continues as for the previously described embodiment, until either (1) the starting and ending states in the same cycle/iteration are identical or (2) all allowed states are exhausted, in which case the state with the smallest metric is taken as the starting and ending state.

Exemplary Software

The present invention also includes algorithms, computer program(s) and/or software, implementable and/or executable in a general purpose computer or workstation equipped with a conventional digital signal processor, configured to perform one or more steps of the method and/or one or more operations of the hardware. Thus, a further aspect of the invention relates to algorithms and/or software that implement the above method(s). For example, the invention may further relate to a computer program or computer-readable medium containing a set of instructions which, when executed by an appropriate processing device (e.g., a signal processing device, such as a microcontroller, microprocessor or DSP device implementing the present Viterbi decoder), is configured to perform the above-described method and/or algorithm For example, the computer program may be on any kind of readable medium, and the computer-readable medium may comprise any medium that can be read by a processing device configured to read the medium and execute code stored thereon or therein, such as a floppy disk, CD-ROM, magnetic tape, hard disk drive, or ROM (e.g., EPROM, boot ROM or flash memory) and/or RAM (e.g., DRAM, SRAM or pseudo-SRAM). Such code may comprise object code, source code and/or binary code.

The data is generally configured for transmission through an appropriate medium, such as copper wire, a conventional twisted pair wireline, a conventional network cable, a conventional optical data transmission cable, or even air or a vacuum (e.g., outer space) for wireless signal transmissions. The data and/or code for implementing the present method(s) are generally digital, and are generally configured for processing by a conventional digital data processor (e.g., a microprocessor, microcontroller, or logic circuit such as a programmable gate array, programmable logic circuit/device or application-specific [integrated] circuit).

In various embodiments, the computer-readable medium or waveform comprises at least one instruction to (i) Viterbi decode the prepended terminal subblock, the serial data block, and/or the appended initial subblock; (ii) enable iteration logic configured to repeat the decoding and estimating step(s) (e.g., iterate the decoding and estimating steps) when the starting and ending states are not identical; (iii) disallow at least the starting state when the starting and ending states (in a given iteration or cycle) are not identical; (iv) disallow the starting and ending states (and the starting/ending states of all intervening iteration[s] or cycle[s]) when the current iteration ending state is identical to a previous iteration/cycle starting state; (v) store the disallowed starting and/or ending state(s) (and optionally, any the disallowed decoded serial data block[s] associated with such disallowed starting and/or ending states); (vi) assign a high metric to the stored disallowed starting and/or ending state(s) (and any stored disallowed decoded serial data block[s]); (vii) compare the estimated starting state and the estimated ending state; and/or (viii) indicate an error if the estimated starting state and the estimated ending state are not identical. Such additional instructions may be combined, as described above with regard to the present method, or as may be otherwise apparent to those skilled in the art.

An Exemplary Circuit

In a further aspect, the present invention relates to a circuit, comprising (a) a buffer configured to receive a serial data block; (b) a decoder configured to (i) decode the serial data block and (ii) estimate a starting state and an ending state for the serial data block; (c) tailbiting logic configured to (i) prepend a terminal subblock of the serial data block to the serial data block and/or (ii) append an initial subblock of the serial data block to the serial data block; and (d) iteration logic configured to instruct the decoder to (i) decode the serial data block and estimate the starting and ending states again when the starting and ending states are not identical, and (ii) remove states that are determined to be unlikely (also termed "disallowed states" herein) from the states that are being considered in the subsequent decoding iterations (so-called "allowed states"). Generally, the decoder is further configured to estimate (1) the starting state from at least a partial sequence of the prepended terminal subblock and/or (2) the ending state from at least a partial sequence of the appended initial subblock, although variations are possible, consistent with the above description regarding the present method. Also, the circuit (or an appropriate logic block therein) may further comprise a comparator configured to determine whether the starting and ending states are identical. Thus, the present invention may relate to a circuit, comprising a means for storing a serial data block; a means for decoding the serial data block and estimating a starting state and an ending state for the serial data block; a means for prepending a terminal subblock and/or appending an initial subblock of the serial data block to the serial data block; and a means for instructing the means for decoding to repeat the decoding and estimating functions when the starting and ending states are not identical.

Consistent with the exemplary iterative tailbiting decoding method(s) described above, in one embodiment, the tailbiting logic may be further configured to prepend a terminal subblock and append an initial subblock of the serial data block to the serial data block, and the decoder may be further configured to estimate the starting state from at least the prepended terminal subblock and/or estimate the ending state from at least a partial sequence of the terminal subblock. When the tailbiting logic is configured to prepend the terminal subblock and append the initial subblock to the serial data block, the decoder is generally configured to estimate (i) the starting state from the prepended terminal subblock and the initial subblock and (ii) the ending state from the terminal subblock and the appended initial subblock. Furthermore, the tailbiting logic (or other logic located elsewhere in the circuit) may further comprise pointer logic configured to indicate (1) a start location in the buffer for the terminal subblock and/or (2) an end location in the buffer for the initial subblock. Thus, the present circuit may further comprise a means for indicating a start location for the terminal subblock and/or an end location for the initial subblock in the data storing means. It is well within the abilities of one skilled in the appropriate art(s) to design, implement and use such pointer logic.

In the case where the tailbiting logic is configured to append the initial subblock to the serial data block (without necessarily being configured to prepend the terminal subblock), the decoder may be configured to output a decoded remainder of the serial data block, then the decoded appended initial subblock. In such a case, the logic may be further configured to instruct or enable the decoder to provide such an output, and the circuit may further comprise output logic configured to reverse, re-order or rearrange the decoded data, such that the decoded appended subblock is subsequently read, output or transmitted before the decoded serial data block remainder. Such output logic may comprise (i) conventional buffers (e.g., shift registers or FIFO buffers) configured to store the decoded data remainder and decoded appended initial data subblock, and (ii) a conventional multiplexer configured to select one of the buffers storing decoded data for output, the control signal for selecting a buffer typically being generated by the tailbiting logic (e.g., using the same logic and/or pointer control signal that indicates the end location of the initial subblock). Thus, the present circuit may include a means for decoding that outputs a decoded remainder of the serial data block, then a decoded appended initial subblock; or alternatively, a decoded prepended terminal subblock, then a decoded "remainder" of the serial data block (e.g., an initial portion of the serial data block, up to the first bit of the terminal subblock that was prepended and decoded).

As described above, an important aspect of the present invention relates to Viterbi decoding the serial data block. Thus, the decoder in the present circuit preferably comprises a Viterbi decoder. In this embodiment, the Viterbi decoder may estimate the starting and ending states by Viterbi decoding (1) the starting state from at least part of the prepended terminal subblock and/or (2) the ending state from at least part of the appended initial subblock.

However, more generally, the decoder in the present circuit may comprise a conventionally-designed convolutional decoder. The convolutional decoder is generally configured to disallow data sequences that fail to comply with a coding constraint on the serial data block, such as the equality (same identity) of the starting and ending states. In a particularly advantageous implementation, the convolutional decoder and the constraint comply with a wireless data transmission protocol selected from the group consisting of IEEE Standard 802.11a, 802.11b, 802.11g, 802.11n, 802.16 and 802.20. Thus, the present circuit may comprise a means for decoding convolutional code that may, in turn, comply with a wireless data transmission protocol selected from the group consisting of IEEE Standard 802.11a, 802.11b, 802.11g, 802.11n, 802.16 and 802.20.

The iteration logic in the present circuit may be further configured to disallow the starting state when the starting and ending states are not identical. In this case, the iteration logic may be further configured to disallow the ending state, a previously estimated starting state, and all intervening starting/ending states when the previously estimated starting state and the ending states are identical (e.g., after one or more intervening iterations, cycles or repetitions of data decoding and starting/ending state estimating by the decoder). Thus, as discussed above with regard to the present method, the present circuit may further comprise one or more memory elements configured to store the disallowed starting and/or ending state(s) (and optionally, the disallowed decoded serial data block). In such a case, the circuit may further comprising metric logic configured to assign a high metric to the (stored) disallowed starting and/or ending state(s) (and optionally, the [stored] disallowed decoded serial data block).

As discussed above, in one embodiment, the circuit comprises an "offload" iterative decoder that performs subsequent iteration(s) only when the tailbiting condition fails at the first decoding attempt (i.e., when the starting and ending states are not identical). The iteration logic in this "offload" iterative decoder may be turned on only when it is needed, so that power consumption can be reduced, while still achieving a SNR gain comparable to conventional tailbiting trellis-based codes. Thus, the present circuit may further comprise a switch configured to enable the iteration logic when the starting and ending states are not identical.

Figure 7:
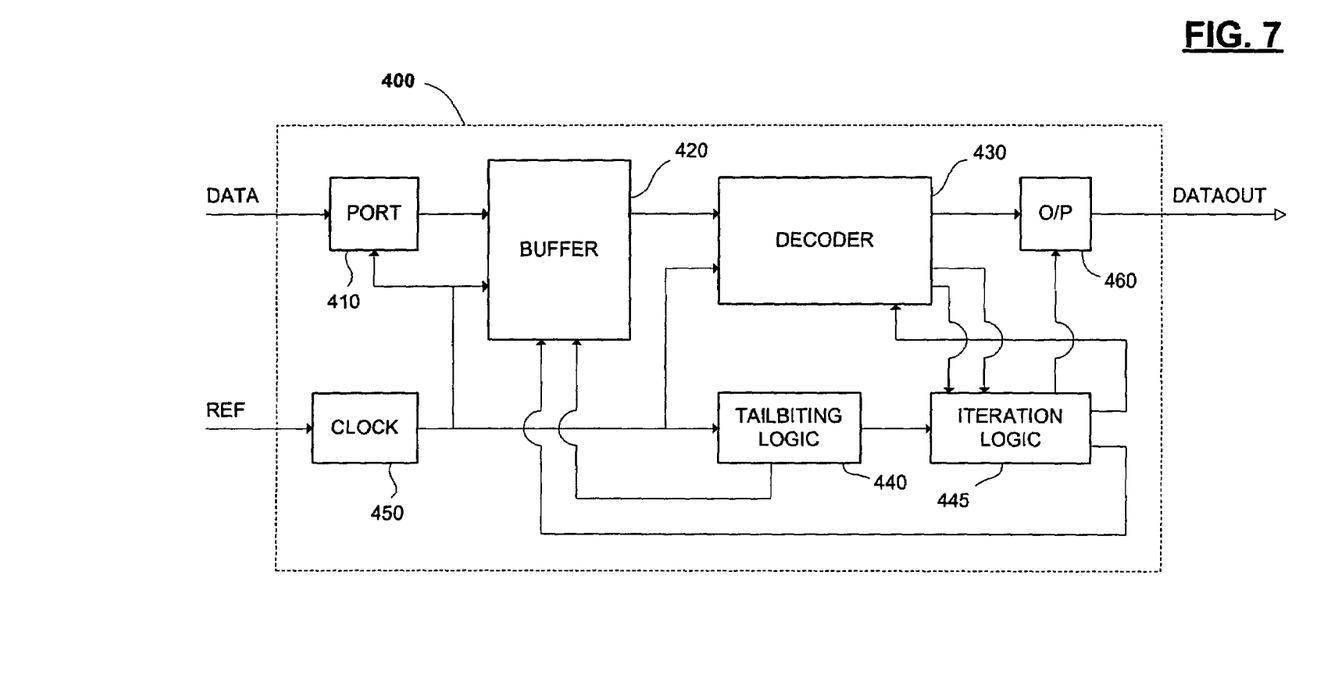
FIG. 7 is a block diagram of an exemplary decoder according to the present invention.

FIG. 7 shows an exemplary receiver 400, including receiving port 410, buffer 420, decoder 430, tailbiting logic 440, iteration logic 445, clock 450 and output circuitry 460. Generally, a serial data block DATA is received from a channel into port 410. The channel is preferably a wireless channel that, for example, is compliant with one or more IEEE standards for wireless communications (e.g., 802.11a, 802.11b, 802.11g, 802.11n, 802.16 and/or 802.20). Port 410 is a conventional (and in one embodiment, wireless) receiving port that may have an antenna communicatively coupled thereto and that is configured to receive analog or digital data DATA (e.g., encoded sequence $z_1 z_2 \ldots z_M$ with [Gaussian] channel noise added thereto; see, e.g., FIG. 2). In the case of analog data, port 410 may comprise conventional sampling and buffer and/or amplifier circuitry. In the case of digital data, port 410 may comprise latch and/or amplifier circuitry. It is well within the abilities of one skilled in the art to design and use such port circuitry.

Buffer 420 generally comprises a memory array configured to store one or more serial data blocks, and may comprise a conventional first-in-first-out (FIFO) buffer, a simplex dual port memory with one or more pointers adapted to identify predetermined bit locations (e.g., the end of the initial subblock, the beginning of the terminal subblock, the midpoint of the serial data block, etc.), one or more shift registers (and if more than one, having a demultiplexer in communication with inputs thereof, configured to store part or all of a serial data block in a particular shift register [e.g., consistent with interleaved data], and a multiplexer in communication with outputs thereof, configured to select part or all of a serial data block in a particular shift register for outputting to decoder 430), etc. In one implementation, buffer 420 comprises an embedded memory.

Decoder 430 typically comprises a Viterbi decoder, configured to decode the serial data block and estimate a starting state and an ending state for the serial data block, generally using a conventional Viterbi algorithm (which may be implemented in hardware and/or software, but typically, in hardware). Thus, the present circuit may include a means for determining a most likely value for the serial data block and/or a means for decoding that estimates (1) the starting state from at least part of the prepended terminal subblock and/or (2) the ending state from at least part of the appended initial subblock. The decoder in the present circuit may be adapted for (i) hard decisions or soft decisions, (ii) punctured code or non-punctured code, and/or (iii) concatenated code (e.g., a convolutional code block concatenated with a block code sequence and/or a second convolutional code block, as described above). Decoder 430 may be further adapted to process code at a conventional rate of k/n, where n>k (or, more consistent with the above description, N/M). Also, when decoder 430 comprises a Viterbi decoder, the Viterbi decoder may be configured to eliminate or "prune" branches from the decoder trellis that correspond to disallowed states (e.g., code containing a data sequence that violates one or more coding constraints or that has been disallowed in a previous decoding cycle or iteration). Thus, the means for determining a most likely value in the present circuit may comprise a means for Viterbi decoding the serial data block, and may estimate the starting and ending states by Viterbi decoding (1) the starting state from at least part of the prepended terminal subblock and/or (2) the ending state from at least part of the appended initial subblock. Furthermore, the present circuit may further comprise a means for disallowing data sequences that fail to comply with a (coding) constraint on the serial data block.

Tailbiting logic 440 provides instructions, commands and/or control signals to the buffer 420 and decoder 430 with regard to the initial and/or terminal subblocks to be appended, prepended and/or read, as the case may be. Thus, tailbiting logic 440 may control (i) reading from and writing to buffer 420, (ii) setting or resetting one or more pointers in buffer 420, (iii) decoding/estimating/determining/calculating functions in decoder 430, etc. Reading from and writing to buffer 420 may be controlled by activation and deactivation of one or more write enable and/or read enable signals, selection of a particular shift register or other memory element within buffer 420 for storing or outputting data respectively using a demultiplexer or multiplexer, etc. The decoder functions are described elsewhere herein, but the timing of such decoder functions (e.g., when to start and/or stop such functions), as well as reading functions within buffer 420 (e.g., reading a particular initial or terminal subblock) may be controlled by one or more counters in tailbiting logic 440. It is well within the abilities of those skilled in the art to design, implement and use logic configured to perform such control functions.

Iteration logic 445 provides instructions, commands and/or control signals to the buffer 420 and/or decoder 430 with regard to subsequent iterations of the decoding and starting/ending state estimation functions and/or processes therein. For example, iteration logic 445 may transmit an enable or "high Z" signal to output block 460, adapted to enable output of decoded data when the starting and ending states match, but disable output of decoded data when the starting and ending states do not match. Thus, the present circuit may comprise a means for comparing the starting and ending states, which may be configured to output a signal adapted to indicate whether or not the starting and ending states are identical. In addition, iteration logic 445 may send a similar enable signal to buffer 420 to control (e.g., enable or disable, as the case may be) read and/or write operations therein, depending on whether the starting and ending states match, as described herein. Thus, the may further comprise a means for enabling the means for instructing when the starting and ending states are not identical.

Figure 8:
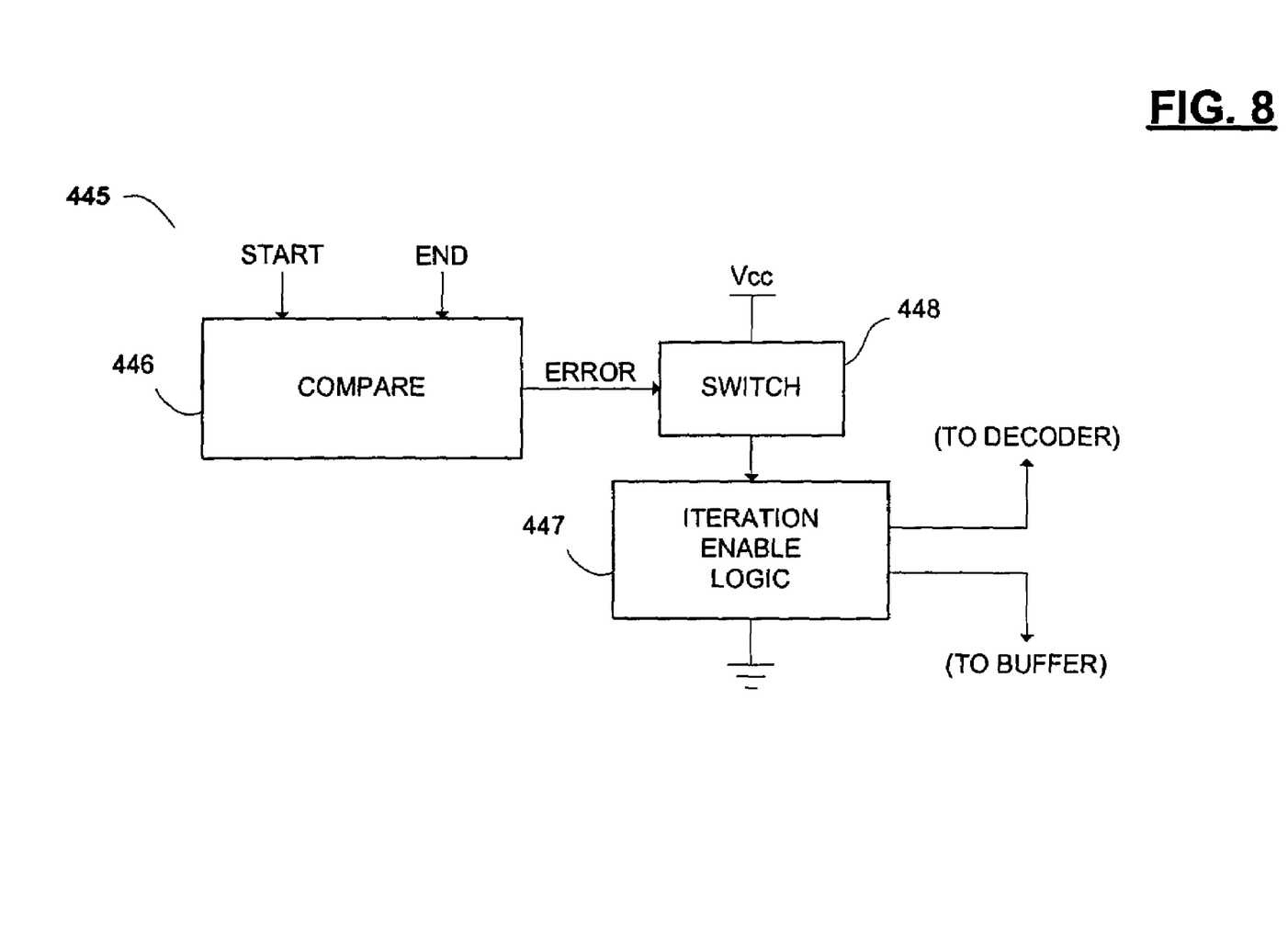
FIG. 8 is a block diagram of exemplary power-saving circuitry for use in one embodiment of the present invention.

Also, as shown in FIG. 8, iteration logic 445 may comprise a comparator 446 configured to (i) receive starting and ending state information (e.g., starting state estimate START and ending state estimate END) from the decoder 430 (see FIG. 6) and (ii) compare the starting and ending states to determine whether they are identical. Comparator 446 may comprise, for example, a conventional multi-input XOR or XNOR gate, adapted to output a control signal (e.g., ERROR) having an inactive state if all bit values in the starting and ending states are the same, and an active state if any bit value in the starting and ending states differs. The control signal ERROR may be input into a switch 447 configured to apply power to iteration enable logic 448 when the starting and ending states are not identical. The control signal ERROR may also be transmitted to other on-chip or off-chip circuitry (e.g., error checking and/or correction circuitry, one or more transmitters in a communicatively-coupled network, etc.) to control functions within such circuitry in a conventional manner (e.g., to enable error checking and/or correction, to retransmit the serial data block, etc.). Iteration enable logic 448 outputs one or more control signals to buffer 420 and/or decoder 430 (see FIG. 7) to repeat the decoding and starting/ending state estimation functions therein. Thus, the circuitry shown in FIG. 8 exemplifies that of an "offload" iterative decoder that performs subsequent decoding iteration(s) only when the tailbiting condition fails. As is understood by those skilled in the art, power consumption can be further reduced by inserting a second, complementary switch between iteration enable logic 448 and ground, configured to receive a complementary control signal (e.g., ERROR*) from comparator 446.

Referring back to FIG. 7, in one embodiment, iteration logic 445 may disallow only one of the starting and ending states when the starting and ending states are not identical. In a suboptimal decoder, one does not know the actual values of either the starting or ending states, so if they are not the same, it is possible that one of the states is correct. Where it is possible that one state could be correct, one may not wish to disallow both states. Thus, in the case where only one state is disallowed, the iteration logic 445 may be further configured to disallow the other of the starting state and the ending state when the starting and ending states are not identical after a first iteration (i.e., repetition) of data decoding and starting/ending state estimating by the decoder 430. Thus, the present circuit may further comprise (i) a means for disallowing one of the starting and ending states when the starting and ending states are not identical, and/or (ii) a means for disallowing the other of the starting state and ending states when the starting and ending states are not identical after a first iteration of the decoding and estimating functions.

Furthermore, as discussed above with regard to the present method, circuit 400 may further comprise (i) one or more memory elements (not shown) configured to store the disallowed decoded serial data block and the disallowed starting and/or ending state(s), and (ii) metric logic configured to assign a high metric to the disallowed decoded data and disallowed starting and/or ending state(s). Thus, the circuit may further comprise a means for storing the disallowed starting and/or ending state(s) (and optionally, any disallowed states from the decoded serial data block), and/or a means for assigning a high metric to the (stored) disallowed starting and/or ending state(s) (and optionally, any stored disallowed states from the decoded serial data block). Such memory elements and metric logic are conventional, and their design, implementation and use are well within the abilities of one skilled in the relevant art(s). For example, the memory elements may be selected from those suitable for buffer 420.

Clock 450 receives a reference clock signal (e.g., REF) and provides a periodic signal having a fixed and/or predetermined frequency to other circuit blocks in receiver 400. The clock or timing signal received in tailbiting logic 440 may be used by one or more counters therein to control the state of one or more control signals generated therein. For example, the counter[s] may count clock cycles needed to read a serial bit stream or a parallel bit sequence corresponding to an initial or terminal subblock from buffer 420.

Figure 2:
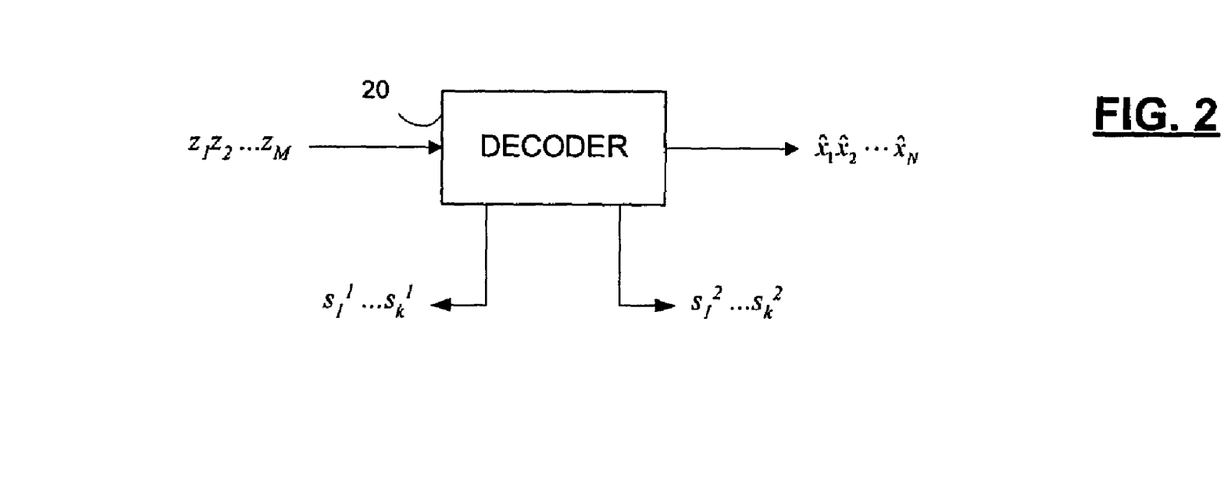
FIG. 2 is a diagram showing a decoder configured to determine whether an ending state for a block of convolutional code is the same as its starting state.

Output circuitry 460 receives decoded data from decoder 430 and provides output data DATAOUT (e.g., decoded, noise-affected sequence $x_1 x_2 \ldots x_N$; see FIG. 2). Output circuitry 460 (a means for outputting the decoded serial data block) is conventional, and may comprise one or more conventional amplifiers and one or more conventional output buffer(s) and/or conventional output driver(s).

An Exemplary Receiver, System and Network

A further aspect of the present invention relates to a receiver, comprising the present circuit and (if not already present or required) a receiver port communicatively coupled to the buffer, configured to receive serial data from a channel. The receiver port is generally as described above with regard to port 410 in the present circuit. In one implementation, the present receiver is embodied on a single integrated circuit. Thus, the receiver may comprise the present circuit as described above, and a means for receiving serial data from a channel, communicatively coupled to a means for storing the serial data, all of which may be embodied on a single integrated circuit.

The receiver may further include a clock circuit configured to provide a reference clock signal to the receiver port and the buffer. In further embodiments, the receiver may convert serial data from the network to parallel data for a downstream device or circuit, and convert parallel data from the device (or the same or different circuit) to serial data for the network.

The present invention relates to a system for transferring data on or across a network, comprising the present receiver and at least one transmitter, communicatively coupled to the receiver port of the receiver, configured to transmit one or more serial data blocks to an external receiver. The system may further comprise an encoder communicatively coupled to the transmitter and configured to generate the serial data block(s). The encoder, which is largely conventional, generally encodes convolutional code, which may be interleaved and/or concatenated as described herein. The encoder in the present system is slightly different, and simpler, than encoders that have been used to generate code having known starting and ending states (e.g., zero-padded data blocks), because the encoder in the present system does not have to add any overhead bits to place the starting and ending states of the serial data block into known states. Thus, the present system may comprise the receiver as described herein, and at least one means for transmitting the serial data block to an external receiver (which may be, but is not necessarily, the present receiver), communicatively coupled to a means for receiving. The system may further comprise a means for generating the serial data block, communicatively coupled to the means for transmitting.

As explained above, the present invention is particularly suited for wireless data communications. Thus, the present system and/or receiver may comply with one or more IEEE Standard for wireless communications (e.g., 802.11a, 802.11b, 802.11g, 802.11n, 802.16 and/or 802.20).

A further aspect of the invention concerns a wireless network, comprising (a) a plurality of the present systems, communicatively coupled to each other; and (b) a plurality of communications devices, wherein each communications device is communicatively coupled to at least one of the systems. Thus, the present wireless network may comprise a plurality of the present systems, communicatively coupled to each other, and a plurality of means for communicating, each being communicatively coupled to at least one of the systems. In various embodiments, the network comprises a wireless network and/or one that is compatible with one or more of IEEE Standards 802.11a, 802.11b, 802.11g, 802.11n, 802.16 and/or 802.20 (preferably one that is compatible with IEEE Standard 802.11a, 802.11g or 802.16), and/or each of the plurality of information blocks may comprise a standard audio data block (80 bits long). The network may have one or more channels (or characteristic signal-carrying frequencies or frequency bands), over which the serial data blocks may be transmitted.

CONCLUSION/SUMMARY

Thus, the present invention generally relates to low-complexity techniques for decoding information, and more specifically, to methods, algorithms, software, circuits and systems for communicating data in a (wireless) network using a low complexity, tailbiting Viterbi decoder. The present invention advantageously reduces the complexity of a suboptimal convolutional decoder, increases the reliability of the starting and ending states, and in certain embodiments, ensures smooth transitions at the beginning and end of the serial data block during decoding, without adding any overhead to the transmitted data block.

The method generally comprises the steps of (a) appending and/or prepending subblocks of the serial data block to the serial data block; (b) decoding the serial data block and estimating starting and ending states for the serial data block; and (c) when the starting and ending states are not identical, repeating the decoding and estimating step(s) and disallowing at least the starting state. The algorithms and software are generally configured to implement one or more of the embodiments of the present method and/or any process or sequence of steps embodying the inventive concepts described herein.

The circuitry generally comprises (a) a buffer configured to receive a serial data block; (b) tailbiting logic configured to append an initial subblock and/or prepend a terminal subblock to the serial data block; (c) a decoder configured to (i) decode the serial data block and (ii) estimate a starting state and an ending state for the serial data block; and (d) iteration logic configured to instruct the decoder to (i) decode the serial data block and (ii) estimate the starting and ending states again when the starting and ending states are not identical. In a further embodiment, the decoder may be further configured to estimate (1) the starting state from at least part of the prepended terminal subblock and/or (2) the ending state from at least part of the appended initial subblock. The systems (e.g., a receiver, transceiver, or wireless network) generally include a circuit embodying one or more of the inventive concepts disclosed herein.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of determining a value for a serial data block, comprising the steps of:
    prepending a terminal subblock of said serial data block to an initial subblock of said serial data block and appending said initial subblock of said serial data block to said terminal subblock of said serial data block to form a modified serial data block;
    estimating starting and ending states for said modified serial data block and, using a decoder, decoding said modified serial data block;
    when said starting and ending states are not identical, performing iterative estimating and decoding step(s) and disallowing said starting state; and
    when said iterative estimating and decoding step(s) are performed and said iteratively estimated ending state is identical to a previously estimated starting state, disallowing said iteratively estimated ending state, said previously estimated starting state, and all intervening starting and ending states.

2. The method of claim 1, wherein the step of decoding comprises determining a most likely sequence for said serial data block.

3. The method of claim 2, wherein said determining step comprises Viterbi decoding said serial data block.

4. The method of claim 1, wherein said initial subblock and said terminal subblock each have a length of at least a traceback depth.

5. The method of claim 1, wherein said serial data block comprises a convolutional code.

6. The method of claim 5, wherein said convolutional code complies with a wireless data transmission protocol.

7. The method of claim 6, wherein said wireless data transmission protocol complies with a standard selected from the group consisting of IEEE Standard 802.11a, 802.11b, 802.11g, 802.11n, 802.16 and 802.20.

8. The method of claim 1, further comprising the step of comparing said estimated starting state and said estimated ending state to determine whether said starting and ending states are identical.

9. The method of claim 1, wherein said disallowing comprises assigning a high metric to said disallowed starting and ending states.

10. A computer-readable medium containing a set of instructions which, when executed by a processor configured to execute computer readable instructions, is configured to perform the method of claim 1.

11. The computer-readable medium of claim 10, comprising at least one instruction to Viterbi decode said serial data block, said prepended terminal subblock and said appended initial subblock.

12. The computer-readable medium of claim 10, further comprising at least one instruction to compare said estimated starting state and said estimated ending state.

13. The computer-readable medium of claim 10, comprising at least one instruction to assign a high metric to said disallowed starting and ending states.

14. A circuit, comprising:
    a buffer configured to receive a serial data block;
    tailbiting logic configured to (i) prepend a terminal subblock of said serial data block to an initial subblock of said serial data block and (ii) append said initial subblock of said serial data block to said terminal subblock of said serial data block to form a modified serial data block;
    a decoder configured to (i) decode said modified serial data block and (ii) estimate a starting state and an ending state for said modified serial data block; and
    iteration logic configured to instruct said decoder to (i) perform iterative decoding of said serial data block and iterative estimating of said starting and ending states when said starting and ending states are not identical, and (ii) disallow a previously estimated starting state and said ending state when said starting and ending states are not identical, and when said iterative estimating and said iterative decoding are performed, disallow said iteratively estimated ending state, said previously estimated starting state, and all intervening starting and ending states when said iteratively estimated ending state is identical to said previously estimated starting state.

15. The circuit of claim 14, wherein said decoder is further configured to estimate said starting state from at least part of said prepended terminal subblock, and said ending state from at least part of said appended initial subblock.

16. The circuit of claim 14, wherein said decoder is further configured to estimate (i) said starting state from at least said prepended terminal subblock and (ii) said ending state from at least said terminal subblock.

17. The circuit of claim 14, further comprising pointer logic configured to indicate (i) an end location in said buffer for said initial subblock and (ii) a start location in said buffer for said terminal subblock.

18. The circuit of claim 14, wherein said decoder is further configured to estimate (i) said starting state from said prepended terminal subblock and initial subblock and (ii) said ending state from said terminal subblock and said appended initial subblock.

19. The circuit of claim 14, wherein said decoder comprises a Viterbi decoder.

20. The circuit of claim 19, wherein said Viterbi decoder estimates said starting and ending states by Viterbi decoding (i) said starting state from at least part of said prepended terminal subblock and (ii) said ending state from at least part of said appended initial subblock.

21. The circuit of claim 14, wherein said decoder comprises a convolutional decoder.

22. The circuit of claim 14, further comprising metric logic configured to assign a high metric to said disallowed starting and ending states.

23. A receiver, comprising:

the circuit of claim 14; and a receiver port communicatively coupled to said buffer, configured to receive serial data from a channel.

24. The receiver of claim 23, embodied on a single integrated circuit.

25. The receiver of claim 23, wherein said receiver complies with a standard selected from the group consisting of IEEE standard 802.11a, 802.11b, 802.11g, 802.11n, 802.16 and 802.20.

26. A system for transferring data on or across a network, comprising:

the receiver of claim 23; and at least one transmitter, communicatively coupled to said receiver port, configured to transmit said serial data block to an external receiver.

27. The system of claim 26, further comprising an encoder communicatively coupled to said transmitter and configured to generate said serial data block.

28. A wireless network, comprising:

a first system as defined in claim 26;

a second system comprising a second receiver and at least one second transmitter communicatively coupled to said second receiver and configured to transmit serial data to a second external receiver, said second receiver comprising:

a second buffer configured to receive said serial data block, second tailbiting logic configured to (i) prepend a terminal subblock of said serial data block to an initial subblock of said serial data block and (ii) append said initial subblock of said serial data block to said terminal subblock of said serial data block to form a modified serial data block;

a second decoder configured to (i) decode said modified serial data block and (ii) estimate a starting and an ending state for said modified serial data block;

second iteration logic configured to instruct said decoder to (i) perform iterative decoding of said modified serial data block and iterative estimating of said starting and ending states when said starting and ending states are not identical, and (ii) disallow a previously estimated starting state and said ending state when said starting and ending states are not identical, and disallow said iteratively estimated ending state, said previously estimated starting state, and all intervening starting and ending states when said iterative estimating and iterative decoding step(s) are performed and said iteratively estimated ending state is identical to said previously estimated starting state; and a second receiver port communicatively coupled to said second buffer, configured to receive serial data from a channel, the second system being communicatively coupled to the first system; and a plurality of communications devices, each of said communications devices being communicatively coupled to at least one of said systems.

* * * * *